United States Patent
Hong et al.

(10) Patent No.: US 9,870,743 B2
(45) Date of Patent: Jan. 16, 2018

(54) DISPLAY APPARATUS

(71) Applicant: Samsung Display Co., Ltd., Yongin (KR)

(72) Inventors: Junki Hong, Bucheon-si (KR); Yanguk Nam, Seoul (KR); Jong Jae Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 125 days.

(21) Appl. No.: 14/683,732

(22) Filed: Apr. 10, 2015

(65) Prior Publication Data

US 2016/0104407 A1    Apr. 14, 2016

(30) Foreign Application Priority Data

Oct. 14, 2014   (KR) .................. 10-2014-0138449

(51) Int. Cl.
*G09G 3/36*     (2006.01)
*G11C 7/04*     (2006.01)
*G11C 19/28*    (2006.01)

(52) U.S. Cl.
CPC ......... *G09G 3/3648* (2013.01); *G09G 3/3677* (2013.01); *G09G 2300/0413* (2013.01); *G09G 2330/045* (2013.01); *G09G 2330/10* (2013.01); *G09G 2330/12* (2013.01); *G11C 7/04* (2013.01); *G11C 19/28* (2013.01)

(58) Field of Classification Search
None
See application file for complete search history.

(56) References Cited

U.S. PATENT DOCUMENTS

| 8,264,448 B2 * | 9/2012 | Shteynberg | ........ H05B 33/0818 |
| | | | 345/102 |
| 2008/0129658 A1 * | 6/2008 | Baek | .................... G09G 3/2942 |
| | | | 345/63 |
| 2008/0143656 A1 * | 6/2008 | Hasegawa | ............ G09G 3/3233 |
| | | | 345/84 |

(Continued)

FOREIGN PATENT DOCUMENTS

| JP | 1995-295517 | 11/1995 |
| JP | 1995-295518 | 11/1995 |

(Continued)

*Primary Examiner* — Duane N Taylor, Jr.
(74) *Attorney, Agent, or Firm* — H.C. Park & Associates, PLC

(57) ABSTRACT

A display apparatus including: a plurality of pixels receiving data voltages in response to gate signals; a drive circuit generating a power voltage and a control signal; a gate driver operating with the power voltage, generating the gate signals and a dummy gate signal in response to the control signal, and supplying the dummy gate signal to the drive circuit; and a data driver operating with the power voltage and generating the data voltages in response to the control signal. The drive circuit measures a temperature of the drive circuit, and a voltage and a current at an output node of the drive circuit generating the power voltage. The measured temperature, voltage and current, and the dummy gate signal are stored in the drive circuit in a predetermined order. This information can be used to detect error states that the display can indicate and use to protect itself from damage.

19 Claims, 7 Drawing Sheets

(56) References Cited

U.S. PATENT DOCUMENTS

| | | |
|---|---|---|
| 2013/0335862 A1 | 12/2013 | Xie et al. |
| 2014/0022684 A1 | 1/2014 | Jiang et al. |
| 2015/0355488 A1* | 12/2015 | Wang .................... G09G 3/3614 |
| | | 349/37 |

FOREIGN PATENT DOCUMENTS

| | | |
|---|---|---|
| KR | 10-0521491 | 10/2005 |
| KR | 10-0529105 | 11/2005 |
| KR | 10-2008-0039719 | 5/2008 |
| KR | 10-2008-0066283 | 7/2008 |

* cited by examiner

DISPLAY APPARATUS

CROSS-REFERENCE TO RELATED APPLICATIONS

This application claims priority from and the benefit of Korean Patent Application No. 10-2014-0138449, filed Oct. 14, 2014, which is hereby incorporated by reference for all purposes as if fully set forth herein.

BACKGROUND

Field

Exemplary embodiments of the present invention relate to a display apparatus, and more particularly, to a display apparatus capable of protecting itself in correspondence with defective states thereof, and storing and expressing the defective states.

Discussion of the Background

A typical display apparatus includes a display panel having a plurality of pixels for forming images, a gate driver supplying gate signals to the pixels, a data driver supplying data voltages to the pixels, a timing controller operating the gate and data drivers, and a voltage generator outputting a power voltage to activate the gate and data drivers. The timing controller and the voltage generator can be mounted on a Printed Circuit Board (PCB).

The gate and data drivers are able to generate the gate signals and the data voltages, respectively, to drive the pixels by operation of the timing controller. The pixels are supplied with the gate signals through a plurality of gate lines and data signals through a plurality of data lines in response to the gate signals. An image can be displayed by means of pixels producing respective gray scales corresponding to each of the data signals.

In operation of the display apparatus, temperatures on the PCB and the voltage generator can become elevated, and excessive voltage or current from the voltage generator can be delivered. Because of that, devices or components of the display apparatus can be physically damaged.

The above information disclosed in this Background section is only for enhancement of understanding of the background of the inventive concept, and, therefore, it may contain information that does not form the prior art that is already known in this country to a person of ordinary skill in the art.

SUMMARY

An exemplary embodiment of the present invention provides a display apparatus capable of protecting itself in response to defective states, such as excessive temperatures or the delivery of excessive voltage or current.

An exemplary embodiment of the present invention also provides a display apparatus capable of storing and expressing defective states thereof.

Additional aspects will be set forth in the detailed description which follows, and, in part, will be apparent from the disclosure, or may be learned by practice of the inventive concept.

An exemplary embodiment of the present invention discloses a display apparatus including a plurality of pixels receiving data voltages in response to gate signals; a drive circuit generating a power voltage and a control signal; a gate driver operating with the power voltage, generating the gate signals and a dummy gate signal in response to the control signal, and supplying the dummy gate signal to the drive circuit; and a data driver operating with the power voltage and generating the data voltages in response to the control signal. The drive circuit may measure a temperature of the drive circuit, and a voltage and a current at an output node of the drive circuit generating the power voltage. The measured temperature, voltage and current, and the dummy gate signal may be stored in the drive circuit in a predetermined order.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
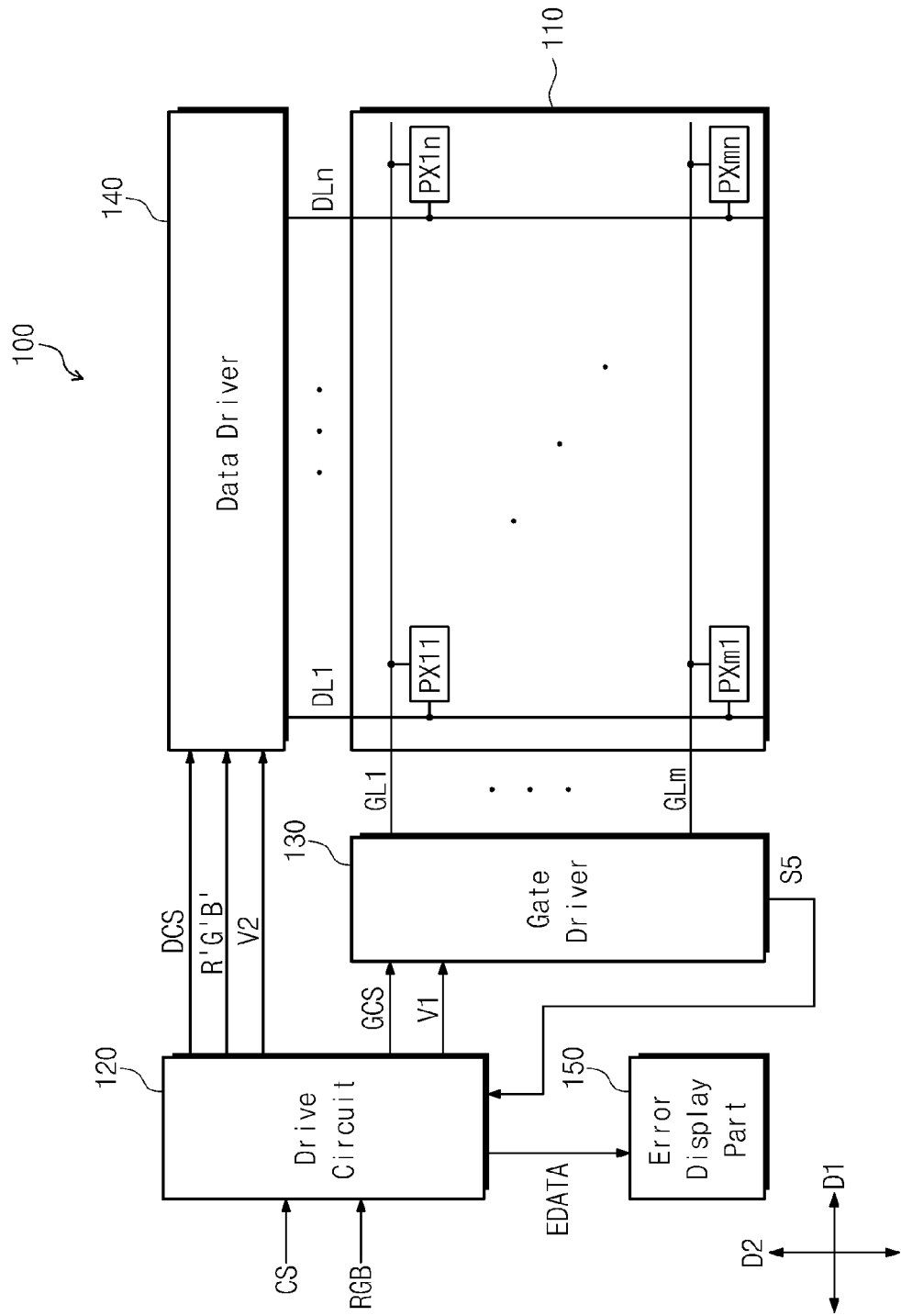
FIG. 1 is a block diagram illustrating a display apparatus according to exemplary embodiments of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Now hereinafter will be described exemplary embodiments of the inventive concept in conjunction with accompanying drawings.

FIG. 1 is a block diagram illustrating a display apparatus according to exemplary embodiments of the invention.

Referring to FIG. 1, the display apparatus 100 includes a display panel 110, a drive circuit 120, a gate driver 130, a data driver 140, and an error display part 150.

The display panel 110 includes a plurality of gate lines GL1 through GLm, a plurality of data lines DL1 through DLn, and a plurality of pixels PX11 through PXmn. The gate lines GL1 through GLm are connected with the gate driver 130, extending in a first direction D1. The data lines DL1 through DLn are connected with the data driver 140, extending in a second direction D2 that intersects the first direction D1. Here, m and n are positive integers.

The pixels PX11 through PXmn are disposed at regions subdivided by the gate and data lines, GL1 through GLm and DL1 through DLn, intersecting each other. Thus, the pixels PX11 through PXmn may be arranged in a matrix pattern. The pixels PX11 through PXmn are connected with their corresponding gate and data lines GL1 through GLm and Dl1 through DLn.

Each pixel PX may display one of the primary colors. The primary colors may include red, green and white. Optionally, not restrictive hereto, the primary colors may further include other diverse colors such as yellow, cyan, magenta, as well as other similar combinations.

The drive circuit 120 receives a control signal CS, image signals RGB, and an input voltage Vin from an external system (e.g. a system board).

The drive circuit 120 generates a gate control signal GCS and a data control signal DCS in response to the control signal CS. The gate control signal GCS is provided to control timing operation of the gate driver 130. The data control signal DCS is provided to control timing operation of the data driver 140.

The drive circuit 120 applies the gate control signal GCS to the gate driver 130 and applies the data control signal DCS to the data driver 140.

The drive circuit 120 converts data formats of the image signals RGB to meet interface specifications with the data driver 140. The drive circuit 120 supplies image signals R'G'B', which have been converted in data formats, to the data driver 140.

The drive circuit 120 increases and decrease the input voltage Vin, which is supplied from an external system (e.g. a system board), to generate power voltages V1 and V2. These power voltages V1 and V2 are differentiated into a first power voltage V1 for activating the gate driver 130, and a second power voltage V2 for activating the data driver 140.

The gate driver 130 generates and outputs gate signals in response to the gate control signal GCS. The gate control signal GCS includes a vertical start signal to activate the gate driver 130. The activated gate driver 130 is able to output the gate signals in sequence. The gate signals are applied to the pixels PX11 through PXmn row by row through gate lines GL1 through GLm.

The data driver 140 generates and outputs analogue data voltages corresponding to image signals R'G'B' in response to the data control signal DCS.

Although not shown, the gate and data drivers, 130 and 140, may be formed of drive chips mounted on a flexible PCB, and may be connected with the display panel 110 via a Tape Carrier Package (TCP).

However, without limitation, the gate driver 130 and data driver 140 may also take the form of drive chips mounted on the display panel 110 via a Chip-On-Glass (COB). In additional embodiments, the gate driver 130 may be formed, together with transistors of the pixels PX, on the display panel 110 in the form of an Amorphous Silicon thin-film-transistor Gate driver circuit (ASG).

The pixels PX are supplied with the data voltages through the data lines DL1 through DLn in response to the gate signals which are provided by way of the gate lines GL1 through GLm. The pixels PX operate to express gray scales corresponding to the data voltages, hence displaying an image.

The drive circuit 120 measures and stores its internal temperature. Additionally, the drive circuit 120 measures and stores a current and a voltage of its output node from which the first and second power voltages V1 and V2 are generated. The drive circuit 120 receives a dummy gate signal S5 from the gate driver 130 and stores the dummy gate signal S5 therein.

The drive circuit 120 operates to protect the display apparatus 100 in accordance with its temperature, a voltage of its output node, a current of the output node, data of which are stored therein, and the dummy gate signal S5.

Additionally, the drive circuit 120 offers the error display part 150 error data EDATA showing whether there is an error in the information about its temperature, its output node voltage, its output node current, all of which are stored in the drive circuit 120, and the dummy gate signal S5.

The error display part 150 operates to indicate normal and error states about a temperature of the drive circuit 120, a voltage of the output node of the drive circuit 120, a current of the output node of the drive circuit 120, and the dummy gate signal S5. This operation will be described in detail.

Figure 2:
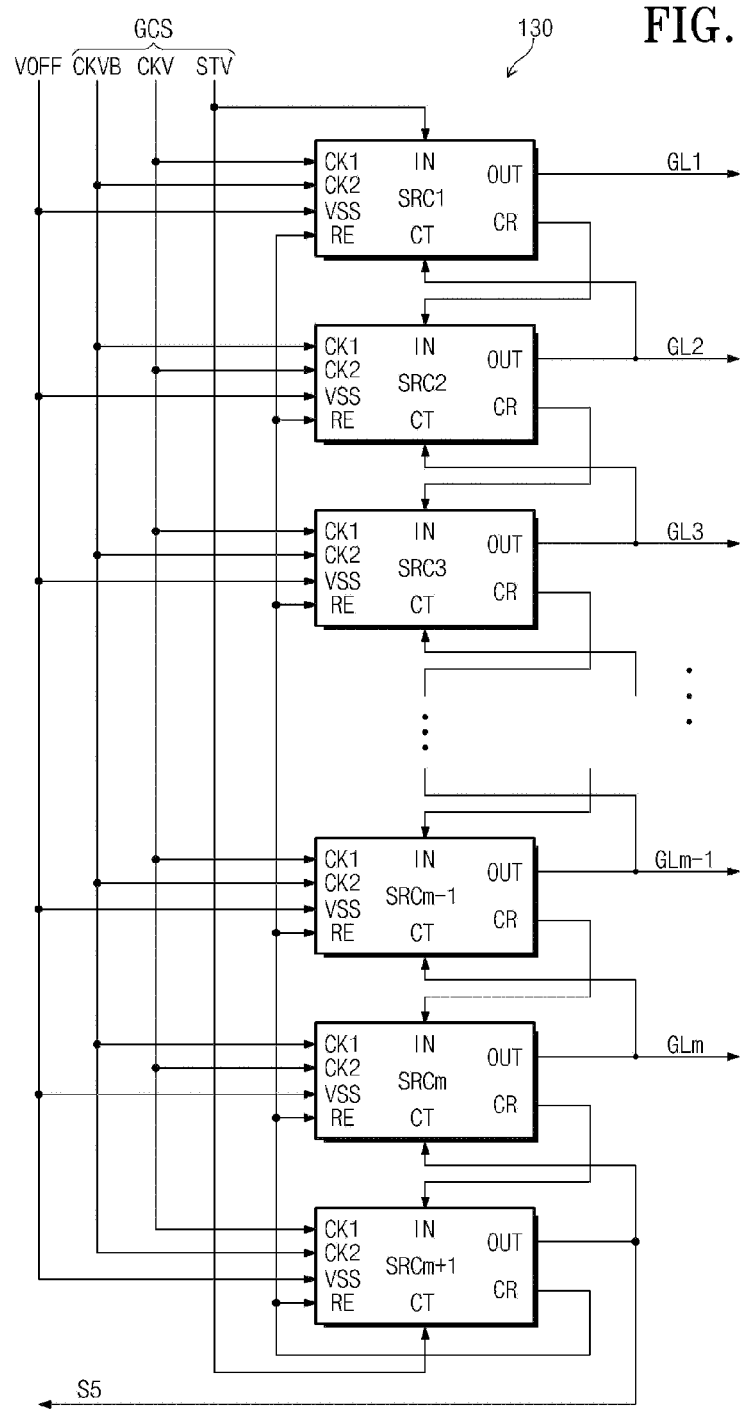
FIG. 2 schematically illustrates an exemplary embodiment of the gate driver shown in FIG. 1.

FIG. 2 schematically illustrates an exemplary embodiment of the gate driver shown in FIG. 1. Referring to FIG. 2, the gate driver 130 includes first to [m+1]'th stages SRC1 through SRCm+1. The gate control signal GCS includes a vertical start signal STV, a first clock signal CKV, and a second clock signal CKVB. The first to [m+1]'th stages SRC1 through SRCm+1 output the gate signals in sequence. The first to [m+1]'th stages SRC1 through SRCm+1 are connected with the first to m'th gate lines GL1 through GLm, outputting the gate signals in sequence. The [m+1]'th stage SRCm+1 may be considered as a dummy stage. The gate signal output from the [m+1]'th stage SRCm+1 is a dummy gate signal S5. The dummy gate signal S5 is applied to the drive circuit 120.

Each of the stages SRC1 through SRCm+1 includes a first clock node CK1, a second clock node CK2, an off voltage node VSS, a reset node RE, a control node CT, a carry node CR, an output node OUT, and an input node IN.

Clock signals are applied to the first clock node CK1 and the second clock node CK2, which are reverse to each other in phase. For instance, the first clock signal CKV is applied to the first clock nodes CK1 of the odd-numbered stages SRC1, SRC3, . . . , SRCm−1 (hereinafter referred to SRC1 through SRCm−1) and the second clock signal CKVB, reverse in phase to the first clock signal CKV, is applied to the second clock nodes CK2 of the odd-numbered stages SRC1 through SRCm−1. For the even-numbered stages SRC2, SRC4, . . . , SRCm (hereinafter referred to as SRC2 through SRCm), the second clock signal CKVB is applied to the first clock nodes CK1 while the first clock signal CKV is applied to the second clock nodes CK2.

The vertical start signal STV is applied to the input node IN of the first stage SRC1 and the control node CT of the dummy stage SRCm+1. Carry signals output from the carry nodes CR of respective prior stages are applied to each of the input nodes IN of the second to [m+1]'th stages SRC2 through SRCm+1. The carry signal output from the carry node CR acts to drive the next stage.

Gate signals output from the output nodes OUT of respective next stages are applied to each of the control nodes CT of the first to m'th stages SRC1 through SRCm. An off voltage VOFF is applied to the off voltage nodes VSS of the stages SRC1 through SRCm. The carry signal output from the carry node CR of the dummy stage SRCm+1 is commonly applied to the reset nodes RE of the stages SRC1 through SRCm+1.

If the first and second clock signals CKV and CKB are set high, they may act as on-voltages capable of driving the pixels. But if the first and second clock signals CKV and CKB are set low, they may act as off-voltages. The output nodes OUT of the stages SRC1 through SRCm+1 output a high level of the clock signal supplied to the first clock node CK1.

For example. The output nodes OUT of the odd-numbered stages SRC1 through SRCm+1 may output a high level of the first clock signal CKV, while the output nodes OUT of the even-numbered stages SRC2 through SRCm may output a high level of the second clock signal CKB. The carry nodes CR of the stages SRC1 through SRCm+1 output carry signals based on clock signals with the same clock signals generated from the output nodes OUT.

Figure 3:
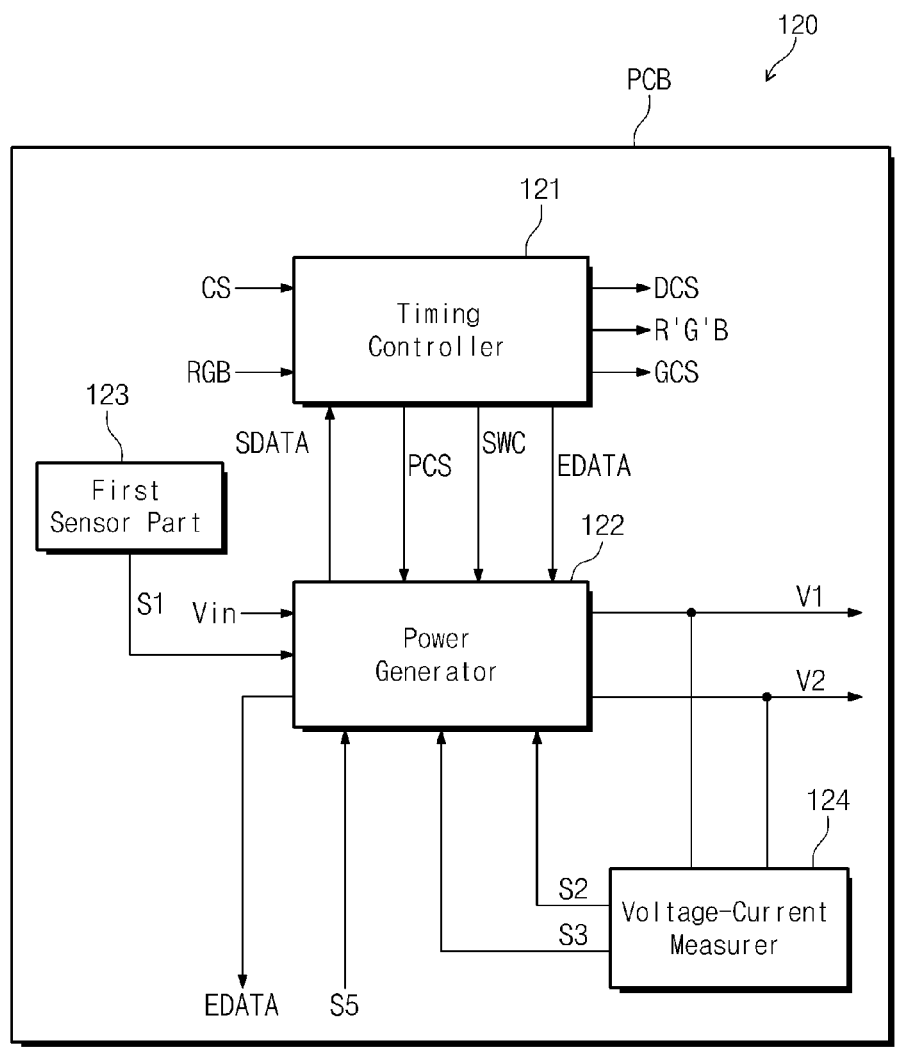
FIG. 3 schematically illustrates an exemplary embodiment of the drive circuit shown in FIG. 1.

FIG. 3 schematically illustrates an exemplary embodiment of the drive circuit shown in FIG. 1.

Referring to FIG. 3, an exemplary embodiment of the drive circuit 120 is illustrated, and includes a printed circuit board PCB, a timing controller 121, a power generator 122, a first sensor part 123, and a voltage-current measurer 124. The timing controller 121, the power generator 122, the first sensor part 123 and the voltage-current measurer 124 may be disposed on the printed circuit board PCB.

The timing controller 121 is supplied with the control signal CS and the image signals RGB. The timing controller 121 generates the gate control signal GCS and the data control signal DCS in response to the control signal CS. The gate control signal GCS is applied to the gate driver 130 and the data control signal DCS is applied to the data driver 140.

The timing controller 121 converts the image signals RGB into image signals R'G'B', which meet data format interface specifications for the data driver. The image signals R'G'B' in the converted data format are supplied to the data driver 140.

The timing controller 121 may be mounted on the printed circuit board PCB in the form of an integrated circuit chip, being connected with the gate driver 130 and the data driver 140.

The power generator 122 is supplied with the input voltage Vin, and increases or decreases the input voltage Vin to generate the first power voltage V1 or the second power voltage V2. The first voltage V1 or second power voltage V2 may be output through an output node of the power generator 122. The first power voltage V1 is supplied to the gate driver 130 and the second power voltage V2 is supplied to the data driver 140 (see FIG. 1).

The power generator 122 may be implemented as a power management integrated circuit (PMIC). That is, the power generator 122 may be mounted on the printed circuit board PCB in the form of integrated circuit chip.

Although not shown, the power generator 122 may generate a voltage for activating the display panel 110. For instance, if the display panel 110 is a liquid crystal display type panel including a pair of substrates opposite to each other with a liquid crystal layer interposed between the substrates, the power generator 122 may generate a common voltage to be supplied to the liquid crystal display panel.

The first sensor part 123 operates to measure a temperature of the printed circuit board PCB and apply a first sensing signal S1 to the power generator 122 in correspondence with the measured temperature. The power generator 122 stores the first sensing signal S1. The first sensor part 123 may include a thermistor.

The voltage-current measurer 124 is connected with an output node of the power generator 122 from which the first power voltage V1 and second power voltage V2 are generated. The voltage-current measurer 124 is connected to the output node of the power generator 122 and operates to measure a voltage and a current at the output of the power generator 122.

The voltage-current measurer 124 supplies a measured voltage as a second sensing signal S2 to the power generator 122. The voltage-current measurer 124 supplies a measured current as a third sensing signal S3 to the power generator 122. The power generator 122 stores the second sensing signal S2 and the third sensing signal S3.

Figure 4:
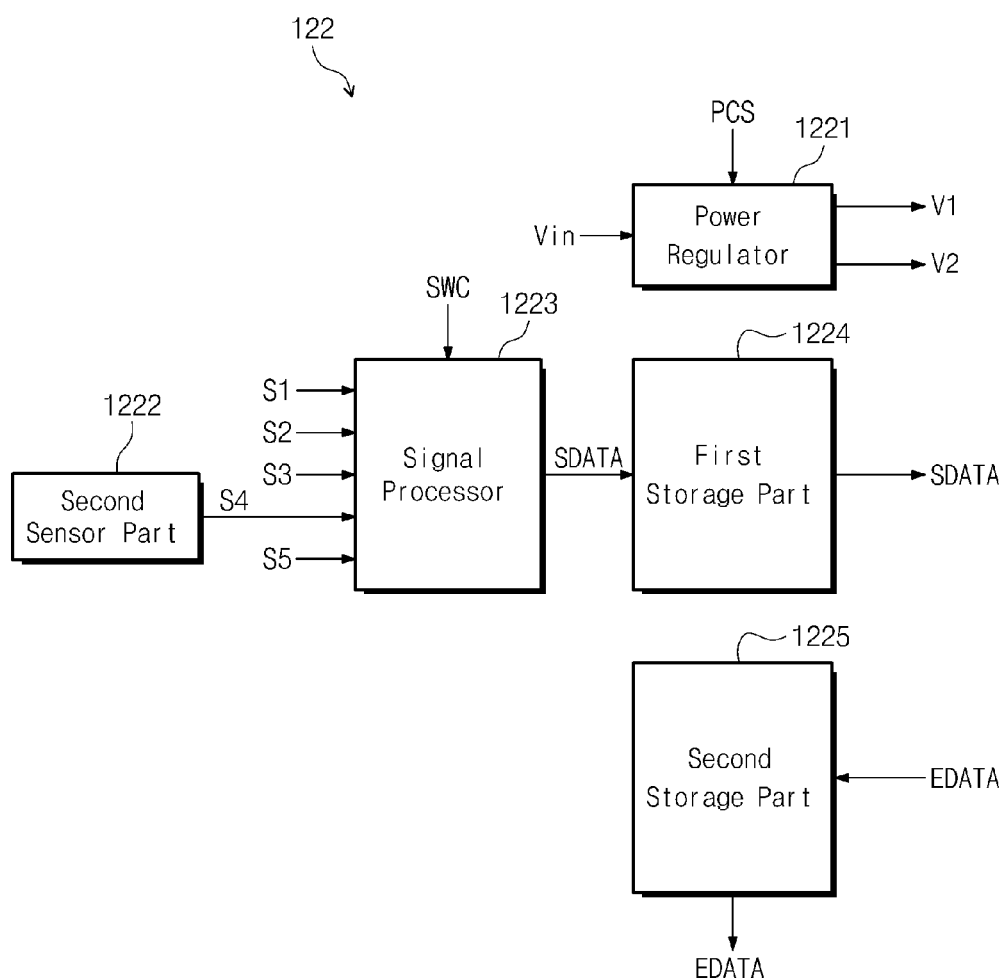
FIG. 4 schematically illustrates an exemplary embodiment of the power generator shown in FIG. 3.

Although not shown, the power generator 122 measures its internal temperature and stores the measured temperature as a fourth sensing signal S4 (see FIG. 4).

The dummy gate signal S5 will be hereinafter referred to as a fifth sensing signal S5. The power generator 122 stores the fifth sensing signal S5 that is supplied from the dummy stage SRCm+1 of the gate driver 130.

The first sensing signal S1 through fifth sensing signal S5 may be sequentially stored in the power generator 122 after a predetermined time from activation of the gate driver 130. This operation will be described later.

The power generator 122 supplies the timing controller 121 with sensing data SDATA corresponding to the first sensing signal S1 through fifth sensing signal S5. The timing controller 121 generates a power control signal PCS to protect the display apparatus 100 in correspondence with error states of the sensing data SDATA. The timing controller 121 applies the power control signal PCS to the power generator 122.

The timing controller 121 determines whether there is an error in the sensing data SDATA, and then supplies the error data EDATA to the power generator 122. The power generator 122 stores the error data EDATA. The power generator 122 supplies the error data EDATA to the error display part 150.

Additionally, the timing controller 121 generates a switching control signal SWC to control the transfer timing of the first sensing signal S1 through fifth sensing signal S5 in the power generator 122. The timing controller 121 applies the switching control signal SWC to the power generator 122.

Hereinafter, operations for protecting the display apparatus 100 and operation of the power generator 122 will be described in accordance with the power control signal PCS and the switching control signal SWC.

FIG. 4 schematically illustrates a configuration of the power generator shown in FIG. 3.

Referring to FIG. 4, an exemplary embodiment of the power generator 122 includes a power regulator 1221, a second sensor part 1222, a signal processor 1223, a first storage part 1224, and a second storage part 1225.

The power regulator 1221 is supplied with the input voltage Vin, and generates the first power voltage V1 and the second power voltage V2. The first power voltage V1 and second power voltage V2 are generated through the output node of the power generator 122.

The second sensor part 1222 measures a temperature of the power generator 122, and supplies the signal processor 1223 with the fourth sensing signal S4 corresponding to the measured temperature. The second sensor part 1222 may include a thermistor.

The signal processor 1223 is supplied with the first sensing signal S1 through fifth sensing signal S5. The first sensing signal S1 through fifth sensing signal S5 may be supplied to the signal processor 1223 in sequence after a predetermined time from activation of the gate driver 130.

Additionally, the signal processor 1223 may be supplied with the first sensing signal S1 through fifth sensing signal S5 every $2^{2k-1}$ frame after receiving the first sensing signal S1 through fifth sensing signal S5 in a first frame. Here, k is a positive integer larger than 1. This operation will be more detailed with reference to FIG. 5 and FIG. 6.

A temperature of the printed circuit board PCB (first sensing signal S1), a voltage and a current at the output node of the power generator 122 (second sensing signal S2 and third sensing signal S3, respectively), a temperature of the power generator 122 (fourth sensing signal S4), a voltage level of the dummy gate signal (fifth sensing signal) S5 are all represented in analogue mode. In other words, the first sensing signal S1 through the fifth sensing signal S5 are analogue signals.

The signal processor 1223 converts the first sensing signal S1 through fifth sensing signal S5 into digital signals which are to be output as the sensing data SDATA. Although not shown, the sensing data SDATA include first sensing data through fifth sensing data respective to the first sensing signal S1 through fifth sensing signal S5.

The first storage part 1224 stores the sensing data SDATA which is supplied from the signal processor 1223. The first storage part 1224 may include registers for storing the sensing data SDATA.

The sensing data SDATA stored in the first storage part 1224 are supplied to the timing controller 121. The timing controller 121 determines error states of the sensing data SDATA, and generates the power control signal PCS to be applied to the power regulator 1221. The power regulator 1221 can be turned off in response to the power control signal PCS, or the voltage and current levels of the first power voltage V1 and second power voltage V2 can be adjusted based on the power control signal PCS.

In detail, the timing controller 121 compares the first sensing data SDATA with a first reference value corresponding to a temperature under which devices of the printed circuit board PCB operate normally.

The timing controller 121 compares the second sensing data SDATA with a second reference value corresponding to a normal level of a voltage appearing at the output node of the power generator 122. The timing controller 121 compares the third sensing data SDATA with a third reference value corresponding to a normal level of a current appearing at the output node of the power generator 122.

The timing controller 121 compares the fourth sensing data SDATA with a fourth reference value corresponding to a temperature under which the power generator 122 operates normally. The timing controller 121 compares the fifth sensing data SDATA with a fifth reference value corresponding to a normal level of the dummy gate signal S5.

If the first sensing data SDATA is beyond a threshold of the first reference value, the timing controller 121 determines the first sensing data SDATA to be in an error state. That is, a temperature of the printed circuit board PCB is detected as being in an error state outside of a normal temperature.

If the second sensing data SDATA is beyond a threshold of the second reference value, the timing controller 121 determines the second sensing data SDATA to be in an error state. That is, a voltage level at the output node of the power generator 122 is detected as being in an error state outside of a normal voltage level.

If the third sensing data SDATA is beyond a threshold of the third reference value, the timing controller 121 determines the third sensing data SDATA to be in an error state. That is, a current level at the output node of the power generator 122 is detected as being in an error state outside of a normal current level.

If the fourth sensing data SDATA is beyond a threshold of the fourth reference value, the timing controller 121 determines the fourth sensing data SDATA to be in an error state. That is, an internal temperature of the power generator 122 is detected as being in an error state outside of a normal temperature.

If the fifth sensing data SDATA is beyond a threshold of the fifth reference value, the timing controller 121 determines the fifth sensing data SDATA to be in an error state. That is, a level of the dummy gate signal S5 is detected as being in an error state outside of a normal level.

The timing controller 121 supplies the second storage part 1225 of the power generator 122 with the error data edata that inform the error states of the sensing data sdata. The second storage part 1225 stores the error data edata.

The second storage part 1225 may include an Electrically Erasable and Programmable Read-Only-Memory (EEPROM) for storing the error data EDATA. The error data EDATA stored in the second storage part 1225 can be read out by and into the error display part 150.

While the display apparatus 100 is operating, temperatures of the printed circuit board PCB and the power generator 122 are elevated in general. If temperatures of the printed circuit board PCB and the power generator 122 are higher than the first and second reference values, devices or components disposed in the printed circuit board PCB and the power generator 122 may be physically damaged due to such hot temperatures. Further, these elevated temperatures will adversely affect operations of the devices or components of the display apparatus 100.

The dummy gate signal S5 is output from the dummy state SRCm+1 that is the last stage in the stages SRC1 through SRCm+1. Therefore, if the dummy gate signal S5 is found to be in a defective state, the gate signals output from the first to m'th stages SRC1 through SRXm are also determined as being in defective states. Consequently, there is no image normally displayed.

Additionally, if the dummy gate signal S5 has a level higher than the normal level, the gate signals will be also higher than the normal level. In this case, excessive currents by the gate signals may adversely affect the devices or components of the display apparatus 100.

In an embodiment, if the first, fourth and fifth sensing data SDATA are in error states, the timing controller 121 outputs the power control signal PCS for turning off the power regulator 1221. The power regulator 1221 may then be turned off in response to the power control signal PCS.

If the power regulator 1221 is turned off, the first and second power voltages V1 and V2 are not supplied respectively to the gate and data drivers 130 and 140 and thus the display apparatus 100 is not further enabled to operate. Therefore, the devices or components of the display apparatus 100 can be protected from the excessive voltage or current.

A voltage and a current generated from the output node of the power generator 122 would be higher than their normal levels. Then, such excessive voltage and current would badly damage devices or components of the gate driver 130 and/or data driver 140.

In an embodiment, if the second or third sensing data SDATA are in an error state, the timing controller 121 outputs the power control signal PCS for adjusting a level of voltage or current generated from the power regulator 1221.

The power regulator 1221 may adjust voltage and current levels, responding to the power control signal PCS, to output normal voltage and current levels. In other words, the power regulator 1221 may lower excessive voltage and current down to the normal voltage and current levels in response to the power control signal PCS.

Consequently, the display apparatus 100 according to exemplary embodiments of the invention may protect itself in correspondence with detected error states.

Figure 5:
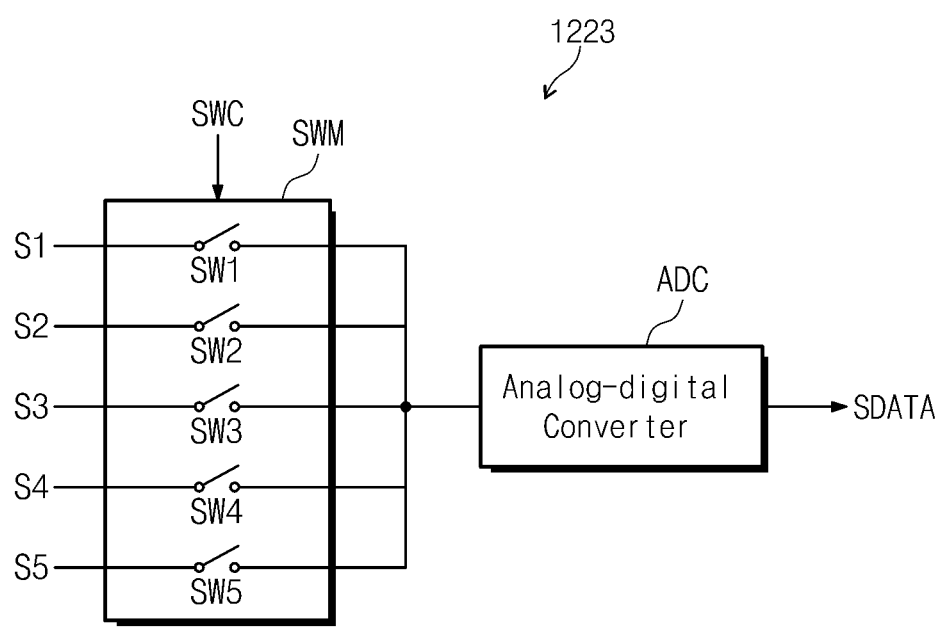
FIG. 5 schematically illustrates an exemplary embodiment of the signal processor shown in FIG. 4.
Figure 6:
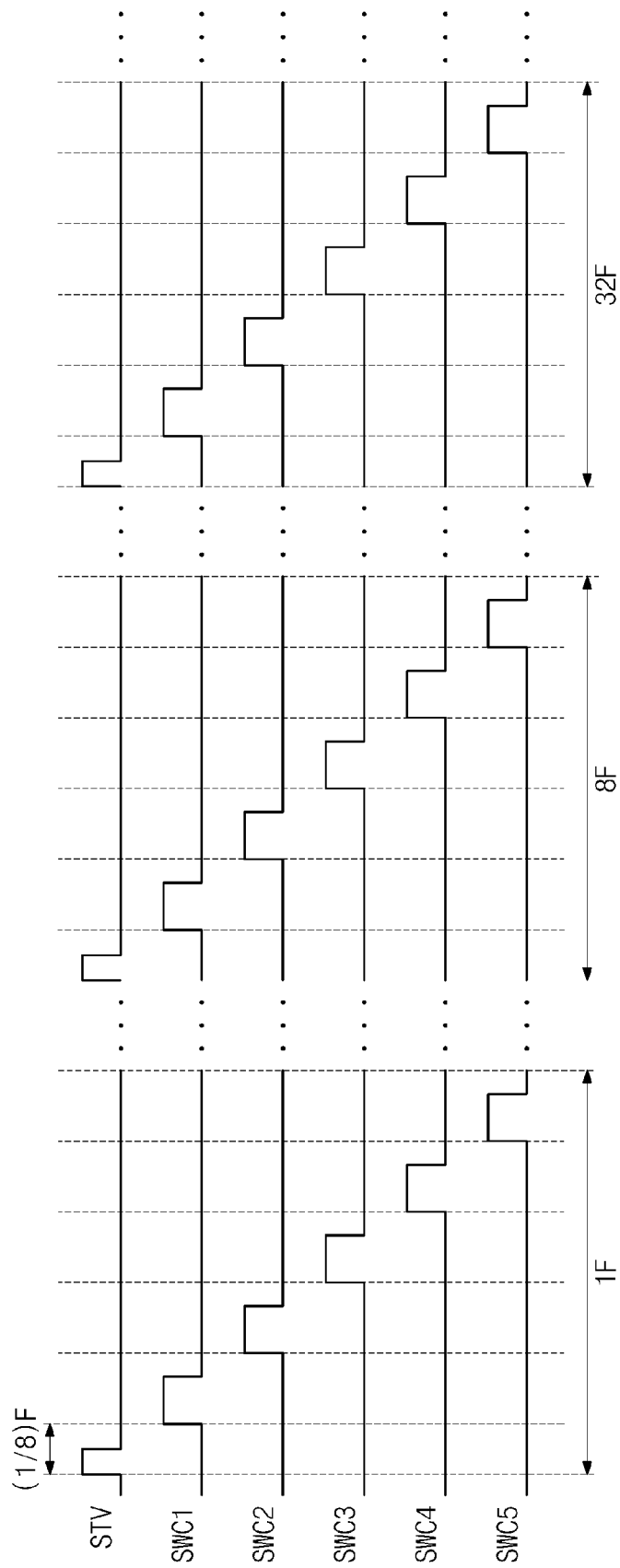
FIG. 6 is a timing diagram illustrating an operation of the switches shown FIG. 5.

FIG. 5 schematically illustrates an exemplary embodiment of the signal processor shown in FIG. 4. FIG. 6 is a timing diagram illustrating an operation of the switches shown FIG. 5.

Referring FIG. 5 and FIG. 6, the signal processor 1223 includes a switch module SWM and an analog-digital converter ADC. While FIG. 5 shows the switch module SWM disposed within the signal processor 1223, this is not meant as a limitation and other locations/arrangements are also possible. The switch module SWM may be also disposed outside of the signal processor. The first sensing signal S1 through fifth sensing signal S5 are supplied to the signal processor 1223 by way of the switches in the switch module SWM.

In detail, the switch module SWM transfers the first sensing signal S1 through fifth sensing signal S5 to the analog-digital converter ADC in response to the switching control signal SWC supplied from the timing controller 121.

The switch module SWM includes first switch SW1 through fifth SW5 correspondingly receiving the first sensing signal S1 through fifth sensing signal S5. As shown in FIG. 6, the switching control signal SWC includes first switching control signal SWC1 through fifth switching control signal SWC5 respective to the first switch SW1 through fifth switch SW5.

The first to fifth switches SW1 through SW5 are conductive respectively by the first to fifth switching control signals SWC1 through SWC5. For instance, as shown in FIG. 6, the first to fifth switching control signals SWC1 through SWC5 are activated (e.g. high levels) in sequence. The first to fifth switches SW1 through SW5 are sequentially turned on correspondingly in response to the first to fifth switching control signals SWC1 through SWC5, respectively.

The first to fifth switching control signals SWC1 through SWC5 are controlled not to overlap with each other in active periods. The first to fifth switching control signals SWC1 through SWC5 make the first to fifth switches SW1 through SW5 not to overlap each other in turn-on periods.

Therefore, the first to fifth sensing signals S1 through S5 are output in sequence and not to overlap with each other based on the operation of the first to fifth switches SW1 through SW5. As a result, the first to fifth sensing signals S1 through S5 can be normally output, without overlapping with each other, through the first to fifth switches SW1 through SW5.

The first to fifth switches SW1 through SW5 are turned on to supply the first to fifth sensing signals S1 through S5, which correspond thereto, to the analog-digital converter ADC.

The first to fifth sensing signals S1 through S5 are sequentially supplied to the analog-digital converter ADC in a frame after a predetermined time from when the vertical start signal STV is applied to the gate driver 130.

For example, in a first frame 1F, the vertical start signal STV is applied to the gate driver 130 when the first frame 1F begins, and the gate driver 130 is activated by the vertical start signal STV.

After a ⅛ frame (⅛)F from when the vertical start signal STV is applied, the first to fifth sensing signals S1 through S5 may be supplied in sequence to the analog-digital converter ADC by way of the first to fifth switches SW1 through SW5.

The ⅛ frame (⅛)F may be defined as a period for stabilizing a drive condition of the display apparatus 100. For instance, the ⅛ frame (⅛)F may be a point of starting to drive the pixels PX11 through PXmn with the gate and data control signals, GCS and DCS, and the first power voltage V1 and second power voltage V2, the signals and voltages being supplied to the gate driver 130 and data driver 140.

The analog-digital converter ADC converts the first to fifth sensing signals S1 through S5 into digital signals and outputs the digital signals as the sensing data SDATA.

The sensing data SDATA may be updated every $2^{2k-1}$ frame and then stored in the first storage part 1224 after being loaded in the first storage part 1224 in the first frame 1F. In other words, after removing previous sensing data, new sensing data may be stored in the first storage part 1224.

In detail, the first to fifth switches SW1 through SW5 are repeatedly turned on every $2^{2k-1}$ frame after once turned on in the first frame 1F. For example, as shown in FIG. 6, the first switch SW1 through fifth switch SW5 may be sequentially turned on in the first frame 1F, thereafter sequentially turned on in an eighth frame 8F, and then sequentially turned on in a 32nd frame 32F.

Although not shown, afterwards, since the first switch SW1 through fifth switch SW5 are repeatedly turned on every $2^{2k-1}$, they may be also sequentially turned on in 128th and 512nd frames. Additionally, although not shown, in other frames, the first switching control signal SWC1 through fifth switching control signal SWC5 are inactivated (e.g. low levels) to turn off the first switch S1 through fifth switch S5.

During this, the first sensing signal S1 through fifth sensing signal S5 are supplied, after first applied to the analog-digital converter ADC in the first frame 1F, to the analog-digital converter ADC by way of the first switch SW1 through fifth switch SW5 every $2^{2k-1}$ frame. Therefore, the first to fifth sensing data SDATA output from the analog-digital converter ADC are permissible to be updated and stored in the first storage part 1224 every $2^{2k-1}$ frame after the first frame 1F.

Figure 7:
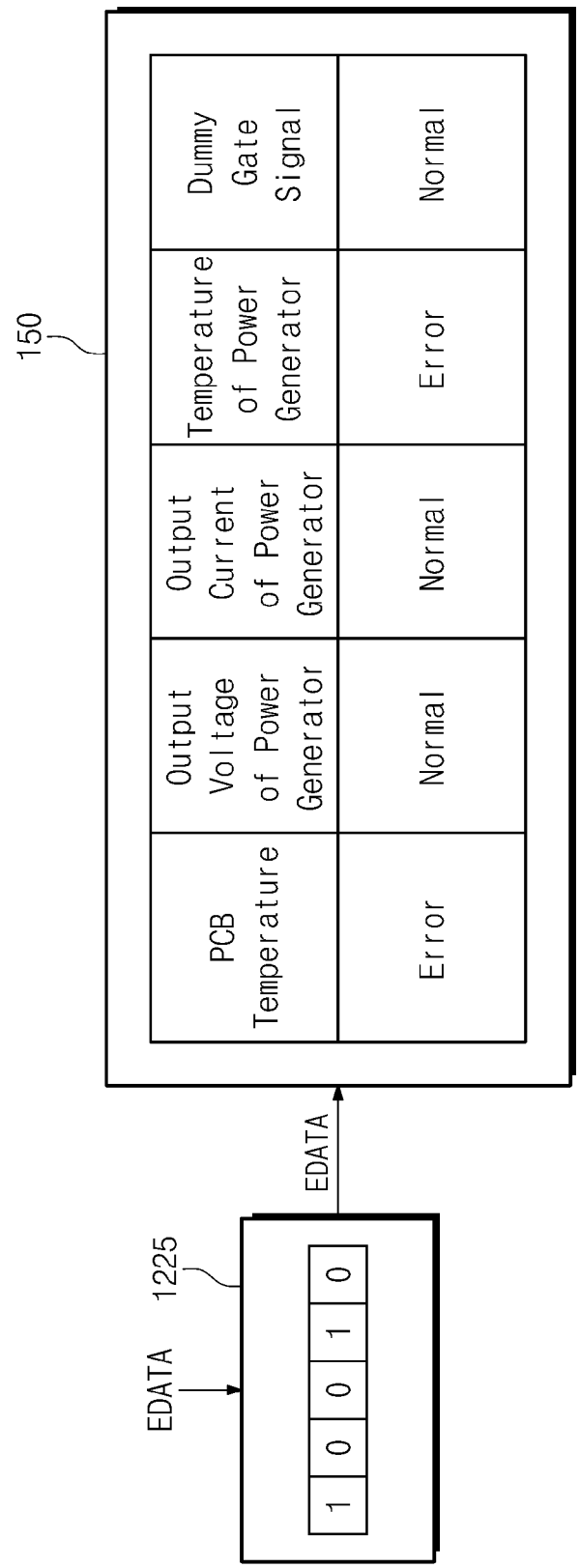
FIG. 7 illustrates the second storage part shown in FIG. 4 and the error display part shown in FIG. 1.

FIG. 7 illustrates exemplary embodiments of the second storage part shown in FIG. 4 and the error display part shown in FIG. 1.

Referring to FIG. 7, the second storage part 1225 stores the error data EDATA from the timing controller 121.

The first and fourth sensing data SDATA may be conditioned in error states but the second, third and fifth sensing data SDATA may be conditioned in normal states. That is, the printed circuit board PCB and the power generator 122 may be in a condition outside of the normal temperatures.

In this condition, the timing controller 121 may set the error data EDATA of the first and fourth sensing data SDATA to be '1', while setting the error data EDATA of the second, third and fifth sensing data SDATA to be '0'. The error data EDATA may be respectively stored in their corresponding bit positions of the second storage part 1225.

For example, the error data EDATA corresponding to the first and fourth sensing data SDATA may be stored in the first and fourth bit positions of the second storage part 1225. Additionally, the error data EDATA corresponding to the second, third and fifth sensing data SDATA may be stored in the second, third and fifth bit positions of the second storage part 1225.

The error display part 150 reads out the error data EDATA from the second storage part 1225. The error display part 150 indicates the states of the error data EDATA by means of the error data EDATA.

The temperatures of the printed circuit board PCB and the power generator 122 are expressed in error states, while the dummy gate signal S5 and the voltage and current at the output node of the power generator 122 are expressed in normal states.

Since it is allowable to store and express/indicate defective states of the display apparatus 100, a user is able to recognize whether there is an error through the error display part 150.

As described above, the display apparatus according to exemplary embodiments of the present invention is capable of protecting itself based on the detection of error states, as well as storing and indicating the error states.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:
1. A display apparatus comprising:
    a plurality of pixels configured to receive data voltages in response to gate signals;
    a drive circuit configured to generate a power voltage and a control signal;
    a gate driver configured to operate with the power voltage, generate the gate signals and a dummy gate signal in response to the control signal, and supply the dummy gate signal to the drive circuit; and
    a data driver configured to operate with the power voltage and generate the data voltages in response to the control signal,
    wherein the drive circuit is configured to:
        measure a temperature of the drive circuit, and
        measure a voltage and a current at an output node of the drive circuit that outputs the power voltage to the gate driver and the data driver,
    wherein the measured temperature, measured voltage, measured current, and the dummy gate signal are stored in the drive circuit in a predetermined order,
    wherein the drive circuit comprises:
        a timing controller configured to generate the control signal;
        a power generator configured to generate the power voltage and receive the dummy gate signal;

a printed circuit board on which the timing controller and the power generator are mounted;
a first sensor part configured to measure the temperature of the drive circuit from the printed circuit board and provide the measured temperature as a first sensing signal to the power generator; and
a voltage-current measurer configured to measure the voltage and the current at an output node of the power generator outputting the power voltage, and provide the measured voltage as a second sensing signal and the measured current as a third sensing signal to the power generator,
wherein the power generator is configured to store the first to third sensing signals, measure a temperature of the power generator, store the measured temperature of the power generator as a fourth sensing signal, and store the dummy gate signal as a fifth sensing signal.

2. The display apparatus according to claim 1, wherein the first to fifth sensing signals are sequentially stored in the power generator after a predetermined time from activation of the gate driver.

3. The display apparatus according to claim 1, wherein the power generator comprises:
a power regulator configured to generate the power voltage;
a second sensor part configured to measure the temperature of the power generator and output the measured temperature as the fourth sensing signal;
a signal processor configured to convert the first to fifth sensing signals into first to fifth sensing data which are digital signals, and output the first to fifth sensing data; and
a first storage part configured to store the first to fifth sensing data,
wherein the first to fifth sensing signals are sequentially provided to the signal processor after a predetermined time from activation of the gate driver.

4. The display apparatus according to claim 3, wherein the signal processor is configured to convert the first to fifth sensing signals, which are provided every $2^{2k-1}$ frame, into digital signals after receiving the first to fifth sensing signals in a first frame, where k is a positive integer larger than 1.

5. The display apparatus according to claim 4, wherein the first to fifth sensing data, after storage in the first storage part in the first frame, are updated every $2^{2k-1}$ frame and stored in the first storage part.

6. The display apparatus according to claim 3, wherein the first storage part comprises registers configured to store the first to fifth sensing data.

7. The display apparatus according to claim 3, wherein the timing controller is configured to receive the first to fifth sensing data, compare the first to fifth sensing data with corresponding first to fifth reference values, and determine the first to fifth sensing data as being in error states if the first to fifth sensing data are beyond thresholds corresponding to first to fifth reference values.

8. The display apparatus according to claim 7, wherein the first reference value is set on a value corresponding to a temperature under which devices of the printed circuit board operates normally, the second reference value is set on a value corresponding to a normal voltage level at the output node of the power generator, the third reference value is set on a value corresponding to a normal current level at the output node of the power generator, the fourth reference value is set on a value corresponding to a temperature under which the power generator operates normally, and the fifth reference value is set on a value corresponding to a normal level of the dummy gate signal.

9. The display apparatus according to claim 7, wherein the power regulator is configured to be turned off by the timing controller when the first, fourth, and fifth sensing data are in error states.

10. The display apparatus according to claim 7, wherein when the second and third sensing data are in error states, the power regulator is configured to adjust levels of the voltage and current, which are output from the power regulator by the timing controller, to normal levels of voltage and current.

11. The display apparatus according to claim 7, wherein the power generator further comprises a second storage part configured to store error data from the timing controller, the error data representing error states of the first to fifth sensing data.

12. The display apparatus according to claim 11, wherein the second storage part comprises an Electrically Erasable and Programmable Read-Only-Memory (EEPROM) to store the error data.

13. The display apparatus according to claim 11, further comprising an error display part configured to read the error data and express normal or error states of the temperature of the printed circuit board, the voltage and current at the output node of the power generator, the temperature of the power generator, and the dummy gate signal.

14. The display apparatus according to claim 3, wherein the signal processor comprises:
a switch module configured to receive the first to fifth sensing signals and output the first to fifth sensing signals in sequence based on signals from the timing controller; and
an analog-digital converter configured to receive the first to fifth sensing signals from the switch module and convert the first to fifth sensing signals into the first to fifth sensing data.

15. The display apparatus according to claim 14, wherein the switch module comprises first to fifth switches corresponding respectively to the first to fifth sensing signals,
wherein the first to fifth switches are configured to receive the first to fifth sensing signals, and sequentially turn on by the timing controller to provide the first to fifth sensing signals to the analog-digital converter.

16. The display apparatus according to claim 15, wherein the first to fifth switches are turned on without overlapping.

17. The display apparatus according to claim 15, wherein a control signal comprises a vertical start signal to activate the gate driver,
wherein the first to fifth switches are sequentially turned on after a predetermined time from when the vertical start signal is applied.

18. The display apparatus according to claim 17, wherein the vertical start signal is applied to the gate driver at the beginning of a frame, and the first to fifth switches are sequentially turned on after ⅛ frame from when the vertical start signal is applied.

19. The display apparatus according to claim 15, wherein the first to fifth switches are repeatedly turned on every $2^{2k-1}$ frame after being turned on at a first frame, where k is a positive integer greater than 1.

* * * * *